United States Patent [19]

Chance et al.

[11] Patent Number: 5,177,594
[45] Date of Patent: Jan. 5, 1993

[54] SEMICONDUCTOR CHIP INTERPOSER MODULE WITH ENGINEERING CHANGE WIRING AND DISTRIBUTED DECOUPLING CAPACITANCE

[75] Inventors: Dudley A. Chance, Newton, Conn.; Evan E. Davidson, Hopewell Junction, N.Y.; Timothy R. Dinger, Croton-on-Hudson, N.Y.; David B. Goland, Bedford Hills, N.Y.; David P. Lapotin, Carmel, N.Y.

[73] Assignee: International Business Machines Corporation, Armonk, N.Y.

[21] Appl. No.: 807,802

[22] Filed: Dec. 13, 1991

Related U.S. Application Data

[63] Continuation of Ser. No. 639,497, Jan. 9, 1991, abandoned.

[51] Int. Cl.⁵ .................... H01L 23/02; H01L 23/12
[52] U.S. Cl. .................... 257/678; 361/412; 361/414; 361/401; 257/684; 257/698; 257/701; 257/723; 257/731
[58] Field of Search .................... 357/74, 80; 361/401, 361/412, 414

[56] References Cited

U.S. PATENT DOCUMENTS

| | | | |
|---|---|---|---|
| 4,202,007 | 5/1980 | Dougherty et al. | 357/380 |
| 4,322,778 | 3/1982 | Barbour et al. | 357/74 |
| 4,328,530 | 5/1982 | Bajorek et al. | 361/308 |
| 4,349,862 | 9/1982 | Bajorek et al. | 361/401 |
| 4,489,364 | 12/1984 | Chance et al. | 361/395 |
| 4,688,151 | 8/1987 | Kraus et al. | 361/405 |
| 4,744,008 | 5/1988 | Black et al. | 361/386 |
| 4,803,595 | 2/1989 | Kraus et al. | 361/412 |
| 4,811,082 | 3/1989 | Jacobs et al. | 357/80 |
| 4,866,507 | 9/1989 | Jacobs et al. | 357/75 |
| 4,926,241 | 5/1990 | Carey | 357/75 |

FOREIGN PATENT DOCUMENTS 58-18950  2/1983  Japan .
61-27667  2/1986  Japan .

OTHER PUBLICATIONS

"Engineering change method not requiring pads", IBM TDB vol. 29, No. 4, Sep. 1986, pp. 1694-1695.
IBM TDB Oct. 1975 vol. 18, No. 5, pp. 1440-1441.
IBM TDB Feb. 1982 vol. 24, No. 9, pp. 4637-4638.
IBM TDB Feb. 1984 vol. 26, No. 9, pp. 4590-4591.
IBM TDB Jan. 1985 vol. 27, No. 8, pp. 4672-4673.
IBM TDB Sep. 1987, vol. 30, No. 4, pp. 1786-1787.

Primary Examiner—Eugene R. LaRoche
Assistant Examiner—Viet Q. Nguyen
Attorney, Agent, or Firm—Perman & Green

[57] ABSTRACT

A semiconductor package is described for supporting and interconnecting semiconductor chips, each chip having contact lands on a contact surface, the package also including a substrate with a contact surface. An interposer module is disposed between at least one chip's contact surface and the substrate's contact surface. The interposer module has first and second opposed surfaces and a first plurality of contact locations positioned on its first surface which mate with a chip's contact land. A second plurality of contact locations on the interposer modules second surface are positioned to mate with contact lands on the substrate. A set of conductive vias are positioned within the interposer module and connect the first plurality of contact locations with a first subset of the second plurality of contact locations. A distributed capacitance layer is positioned within the interposer and is adjacent to its first surface. Adjacent to the second surface are X and Y lines which can be used to make engineering change interconnections.

8 Claims, 11 Drawing Sheets

SEMICONDUCTOR CHIP INTERPOSER MODULE WITH ENGINEERING CHANGE WIRING AND DISTRIBUTED DECOUPLING CAPACITANCE

This is a continuation of copending application Ser. No. 07/639,497 filed on Jan. 9, 1991, abandoned.

FIELD OF THE INVENTION

This invention relates to semiconductor device packaging and, more particularly, to an interposer module disposed between a semiconductor and an interconnection substrate.

BACKGROUND OF THE INVENTION

It is the practice today to mount many integrated circuit chips on a common substrate, which substrate interconnects to the chips via input/output contact lands. Such common substrates include multiple layers of ceramic sheets having printed wiring and thousands of vias which selectively interconnect the printed wiring in the various layers. It frequently becomes necessary to modify the internal circuitry within such substrates to correct for defective lines and/or vias and to make changes in the circuitry to accommodate design alterations to the semiconductor chips.

A number of techniques are present in the prior art for accomplishing engineering changes to chip/module package arrangements. In U.S. Pat. No. 4,489,364 to Chance et al., a chip carrying module is described that includes engineering change lines buried in the module. Those engineering change lines are interrupted periodically and connect to a set of vias extending to the upper surface of the module between chips mounted thereon. There, the vias are interconnected by dumbbell-shaped pads which include a narrow link. By subsequent laser deletion of the link, circuit lines can be disconnected and other dumbbell-shaped pads can be interconnected by means of additive wiring.

Another technique for making engineering changes involves the use of an interposer module between a semiconductor chip and an underlying ceramic substrate. In U.S. Pat. No. 4,202,007 to Dougherty et al., an interposer module is shown which supports a semiconductor chip having bump-like contacts The interposer module interconnects those contacts, via internal wiring, to contact lands on the main substrate. Engineering changes are accomplished by changing the internal wiring within the interposer module.

A similar interposer module is shown in U.S. Pat. No. 4,803,595 to Kraus et al. In that patent, engineering change pads and discrete wires are avoided by employing an interposer module with X and Y wiring planes. Engineering changes are accomplished by selectively removing via interconnections within the interposer module. Additionally, short jumper metallurgy may be applied between appropriate internal wiring planes and vias to provide additional internal interconnections. Kraus et al. also show the use of a decoupling capacitor mounted on the surface of the interposer structure, adjacent to semiconductor chips supported thereon. The decoupling capacitor is connected to internal wiring in the interposer.

A number of publications describing various interposer structures are found in issues of the IBM Technical Disclosure Bulletin. McMahon, Jr., in Vol. 18, No. 5, Oct. 1975, pages 1440, 1441, shows an interposer structure with correction pads on its uppermost surface to enable engineering changes. In Vol. 24, No. 9, Feb. 1982, pages 4637, 4638, an interposer structure is shown by Ecker et al. which, when combined with engineering change pads on the surface of a common substrate that supports the interposer, enables engineering changes to be made. In Vol. 29, No. 4, Sep. 1986, pages 1694, 1695 a further interposer/engineering change system is described which employs replacement interposers. The interposer of this publication employs unused bump lands on a chip and connects them to engineering change channels buried in a common substrate. X and Y buried engineering change wires within the interposer are employed. In Vol. 26, No. 9, Feb. 1984, pages 4590, 4591, Feinberg et al. show a pair of interposers that support the periphery of a master chip which has a slave chip mounted beneath it and between the interposers. In Vol. 27, No. 8, Jan. 1985, pages 4672, 4673, Harvilchuck et al. describe still another interposer which contains signal redistribution networks that reduce the number of required ceramic layers in the common supporting module. In Vol. 30, No. 4, Sep. 1987 pages 1786, 1787 an interposer chip carrier is described which includes decoupling capacitors interconnected to edges of the module. These capacitors provide for decoupling action within the module.

As is further known, decoupling capacitances are often found necessary in electronic packaging. It is generally desirable to position the decoupling capacitance as close as possible to the semiconductor chip. In U.S. Pat. No. 4,328,530 to Bajorek et al., such coupling capacitances are placed in notches within a substrate in an attempt to locate the capacitance as close as possible to the solder bonds between the chips and the substrate. Stacks of laminated ceramic capacitors are inserted into the slots and serve as power planes. In another patent to Bajorek et al. (U.S. Pat. No. 4,349,862), a chip-carrying module is described wherein decoupling capacitors are placed internal to the module between interconnecting vias. Bajorek (FIG. 2) also shows the use of interposer modules to support semiconductor wafers and locates the decoupling capacitors therein. In U.S. Pat. No. 4,744,007 to Black et al., still another electronic packaging technique including decoupling capacitances is shown. In this instance, the decoupling capacitances are electrically coupled to input/output contacts of the semiconductor chip, with the capacitances being mounted below the chip, as discrete devices.

More powerful and faster computers are possible with more chips and shorter interconnection lengths between chips. It therefore becomes important to reduce the spacings between chips while maintaining the wiring capability of the substrate. An engineering change scheme that uses the surface area of the substrate or reduces the wiring capability of the substrate defeats the optimum package objective. Thus, an interposer engineering change scheme with surface mounted decoupling capacitors or a capacitor interposer with an engineering change scheme that uses wiring in the substrate are less than optimum.

Accordingly, it is an object of this invention to provide a module where integrated circuit chips are mounted in a planar wall-to-wall configuration on a common ceramic substrate.

It is another object of this invention to provide an improved interposer module for supporting semiconductor chips on a common ceramic substrate.

It is still another object of this invention to provide an interposer module having integral decoupling capacitance provided within the module.

It is yet another object of this invention to provide an interposer module having engineering change capability provided by X/Y interconnection lines which may be selectively connected to or disconnected from vias within the module.

SUMMARY OF THE INVENTION

A semiconductor package is described for supporting and interconnecting semiconductor chips, each chip having contact lands on a contact surface, the package also including a substrate with a contact surface. An interposer module is disposed between at least one chip's contact surface and the substrate's contact surface. The interposer module has first and second opposed surfaces and a first plurality of contact locations positioned on its first surface which mate with a chip's contact land. A second plurality of contact locations on the interposer module's second surface are positioned to mate with contact lands on the substrate. A set of conductive vias are positioned within the interposer module and connect the first plurality of contact locations with a first subset of the second plurality of contact locations. A distributed capacitance layer is positioned within the interposer and is adjacent to its first surface.

DETAILED DESCRIPTION OF THE INVENTION

Figure 1:
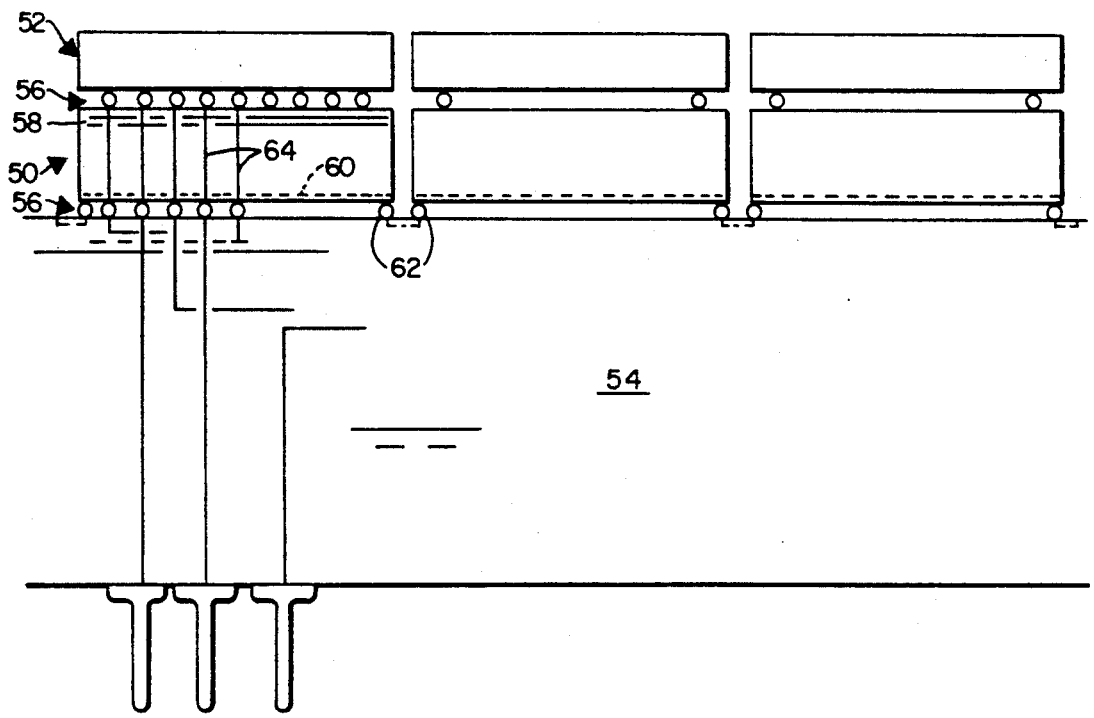
FIG. 1 is a schematic view of a semiconductor package incorporating the invention hereof.

Referring now to FIG. 1, an interposer module 50 is shown supporting an LSI circuit chip 52 and mounted on a ceramic interconnection substrate 54. Both silicon chip 52 and interposer module 50 are joined to their respective supporting surfaces by solder balls 56. Interposer module 50, at its upper surface, is provided with voltage distribution planes 58 which are separated by decoupling capacitance layers. At the lowermost surface of interposer module 50 are located engineering change wiring layers 60 which make connection to various of solder balls 56.

Connections between interposer modules 50 are made by peripheral solder balls 62 and subsurface interconnect lines within substrate 54. It is to be noted that the provision of interposer modules 50 between chips 52 and ceramic substrate 54 enables a very dense packaging configuration with the utmost use being made of exposed substrate surface area.

Substrate 54 is preferably a multilayer glass-ceramic structure including circuit patterns disposed therebetween. The structure and a preferred process for producing such a substrate is described in U.S. Pat. Nos. 4,301,324 to Kumar et al. and 4,234,367 to Herron et al., both assigned to the same assignee as this application.

Interposer module 50 is similarly comprised of multilayers of a glass-ceramic structure and includes thin film interlayers of conductive metal circuitry to provide both engineering change capabilities and voltage distribution. A plurality of vias 64 provide signal communication between specific ones of upper and lower solder balls 56.

Figure 2:
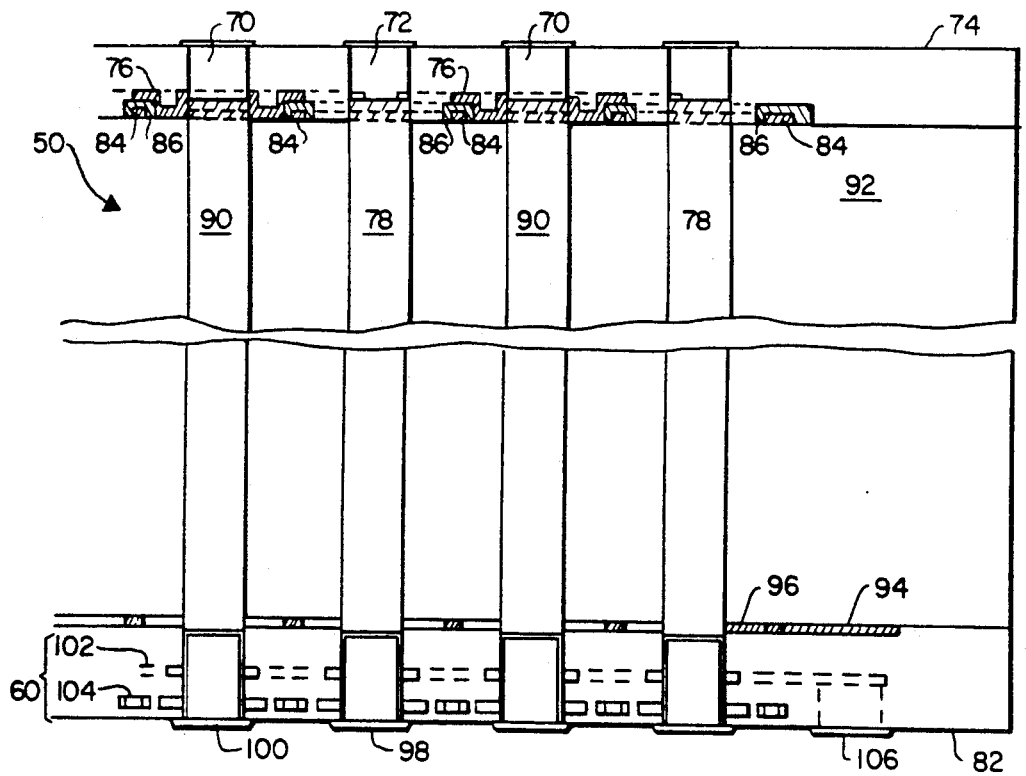
FIG. 2 is a schematic cross-section of an interposer module incorporating the invention hereof.

In FIG. 2, a schematic sectional view is shown of interposer module 50. A plurality of solder ball cavities 70, 72 etc. are formed into an upper polyimide surface 74 on interposer module 50. Certain of the solder ball cavities (e.g. 70) make electrical connection with an upper voltage distribution layer 76, while others make direct interconnection with vias 78. It is to be noted that vias 78 pass through openings 80 in voltage distribution layer 76 and do not make interconnection therewith. Such vias are used for signal interconnection between the top of interposer module 50 and its bottommost surface 82.

A lower voltage distribution layer 84 is disposed beneath upper voltage distribution layer 76 and is separated therefrom by a dielectric layer 86. Dielectric layer 86 provides a distributed capacitance between voltage distribution layers 76 and 84 and enables the provision of decoupling capacitance directly beneath solder ball cavities 70. Each of cavities 70 is connected to upper voltage distribution layer 76. Vias 90 are connected to the lowermost surface of upper voltage distribution layer 76, thereby enabling interconnection of layer 76 to both the uppermost and lowermost surfaces of interposer module 82. Vias, connected to lower voltage distribution layer 84, are not shown as they are in a different section plane than that shown in FIG. 2.

The body 92 of interposer module 50 is comprised of a glass-ceramic, much the same as described for interconnection module 54 in FIG. 1. On the lowermost surface of interposer module 50 is a conductive ground plane 94 having holes 96 provided therein through which pass vias 78 and 90. Each of vias 78 and 90 makes contact to a lower solder ball cavity 98, 100, respectively. Cavities 98, 100 etc. are interconnected by orthogonally oriented wiring layers 102 and 104 within engineering change wiring layer 60.

Engineering change wiring layer 102 makes connection with peripheral solder ball cavities 106 on the leftmost and rightmost extents of interposer module 50, whereas engineering change wiring layer 104 makes contact with similar (not shown) solder ball cavities on the innermost and outermost extents of interposer module 50 (from the vantage point of the reader). It will be noted that peripheral solder ball cavities 106 make connection to an engineering change layer but do not make connection with a via (and thus provide engineering change capability, when connected with an appropriate via through deposited metal or wire in the engineering change layer).

As can be seen from FIG. 1, interposer module 50 is emplaced on substrate 54 so that solder balls 56 on the upper surface of substrate 54 mate with solder ball cavities 98, 100 etc. A subsequent reflow operation enables electrical interconnections to be made therebetween. If an engineering change is required, one or more of solder balls 56 on substrate 54 are removed so that an interconnection to a solder cavity (e.g. 98 in FIG. 2) is broken, and a deposited metal connection is made to an appropriate engineering change line 102 or 104 of FIG. 2 to enable an engineering change interconnection to be made. Chip 52 interconnects to upper solder ball cavities 70, 72, etc. Thus, the entire system can be reflowed at the same time to enable complete interconnection of a multiplicity of chips, interposer modules and the interconnection substrate.

Figure 3:
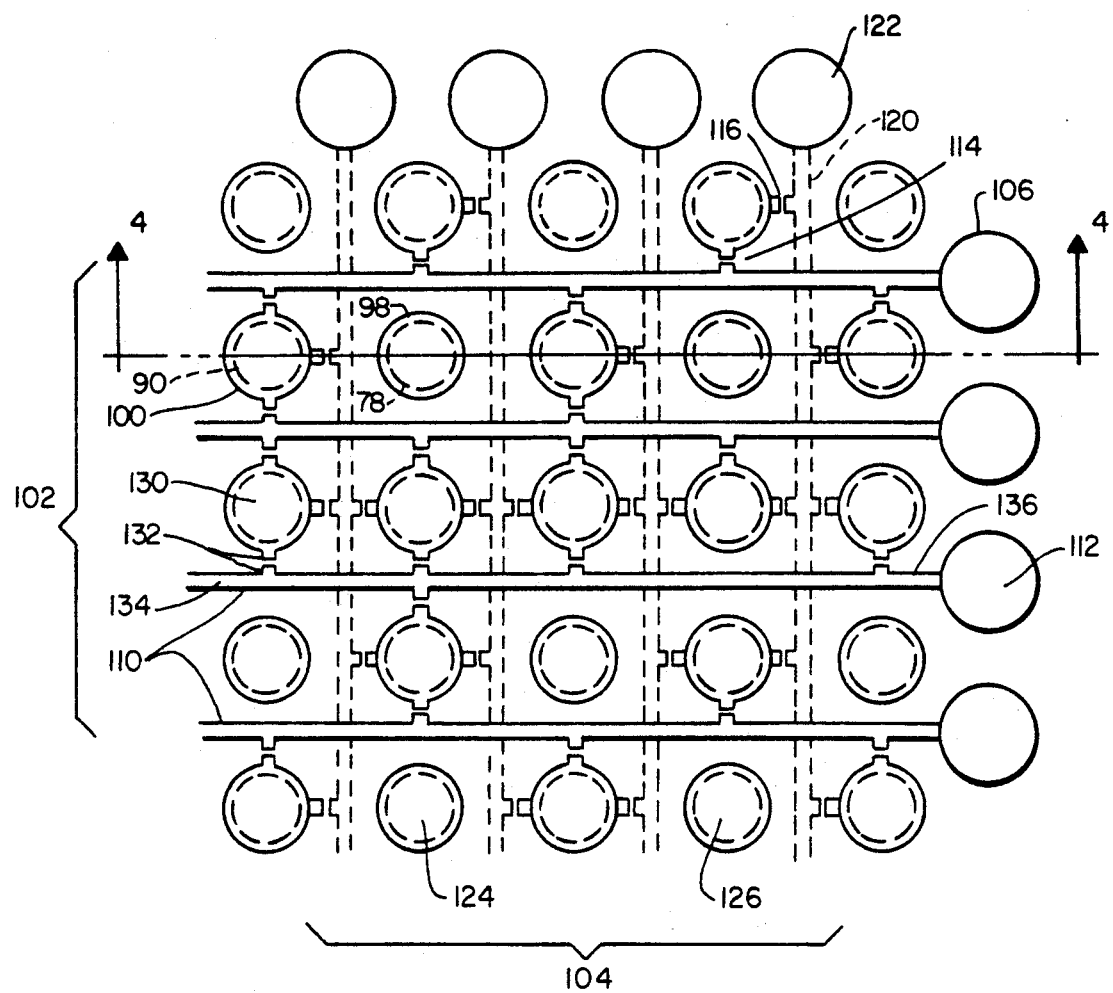
FIG. 3 is a plan view of X and Y engineering change wiring layers within the interposer module.
Figure 4:
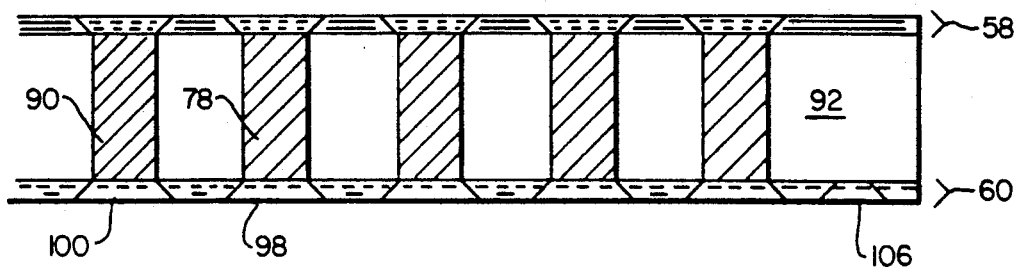
FIG. 4 is a sectional view taken along line 4—4 in FIG. 3.

Turning now to FIGS. 3 and 4, details are shown of a pair of X and Y engineering change interconnection layers. FIG. 4 is a schematic sectional view along line 4—4 in FIG. 3. X layer 102 is comprised of a plurality of X-oriented conductor lines 110 which interconnect at either end of the interposer module, with engineering change solder cavities 112. A subset of vias is provided with interconnection tabs 114 that mate with coincident interconnection tabs on the X engineering change conductors. In addition, those vias are also provided with interconnecting tabs 116 which provide interconnection capability with Y-oriented engineering change lines 120. Each Y-oriented engineering change line 120 is connected to a solder cavity 122, at either of its extremities. Certain vias (e.g. 124, 126) are not provided with tabs 114 and/or 116 and thus do not have engineering change capability.

X and Y engineering change layers 102 and 104 may be fabricated in the usual sequential manner of thin film, multilayer, metalization techniques using chrome-copper-chrome metalizations, separated by polyimide dielectric. They also may be fabricated by a decal transfer and bonding technique, as will be hereinafter be described.

To reroute a wire from one solder cavity to another, tab 114 or 116 is interconnected and either an X or Y line is severed so as to enable connection to be made to only one of the two solder cavities connected to the X or Y line. For instance, if it is desired to reroute a wire from solder cavity 130 to engineering change solder cavity 112, a laser may be used to remove polymer layers over the metal tabs 132. Laser enhanced deposit of copper by chemical vapor deposition or a wire strap may be then used to join tabs 132 to each other. Since the connection is to be made to pad 112 only, a cut 134 is made in line 136, thereby disconnecting the remote-end solder cavity (not shown) from solder cavity 112. To complete the interconnection, the solder ball immediately underlying solder cavity 130 is removed. Cavity 112 is already interconnected to an adjoining interposer module by a surface connection on substrate 54 or a subsurface wiring interconnection therein. A similar interconnection at another appropriate interposer module completes the other end of the line. Right angle turns are made at intersections where X and Y wiring cross. A laser is used to remove polymer layers over the lines and metal deposited to connect the lines.

Y level interconnections are made similarly to the aforedescribed X interconnection scheme. It can thus be seen that the tabs 114, 116 and peripheral solder cavities 112 enable a substantial number of engineering changes to be accomplished and, to a large extent, avoid the need for modifications to internal wiring within substrate 54.

Figure 5:
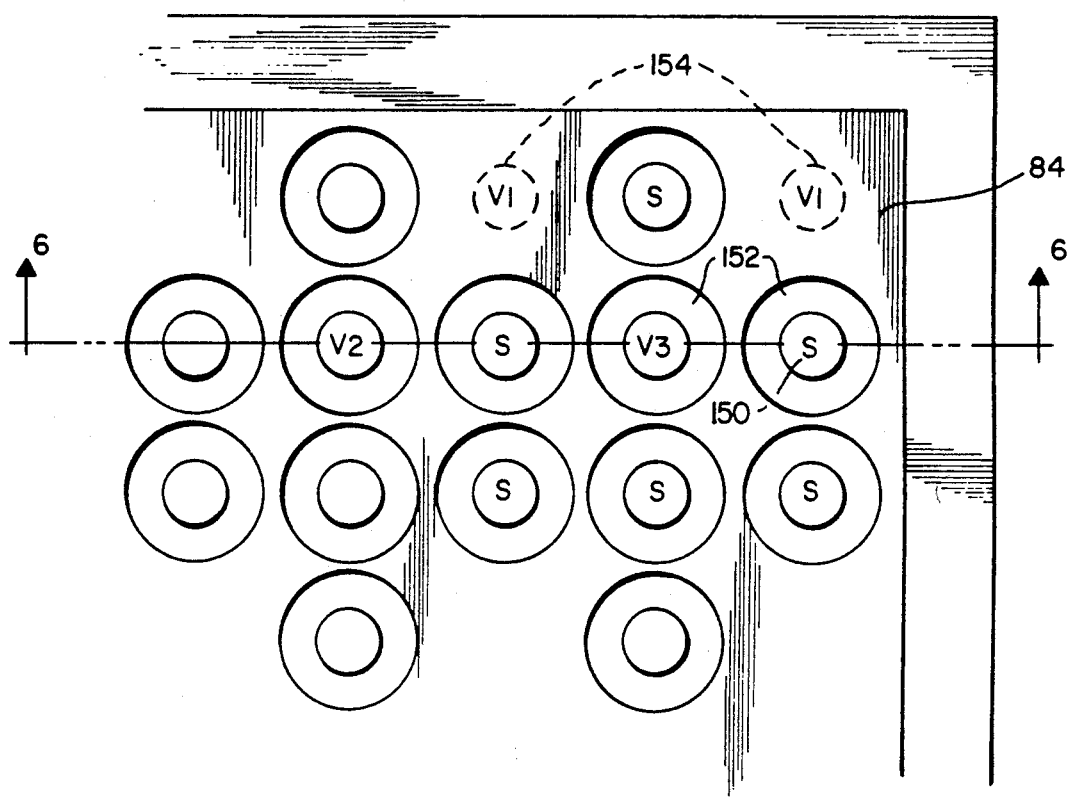
FIG. 5 is a plan view of a first capacitive metal layer within the interposer module.
Figure 6:
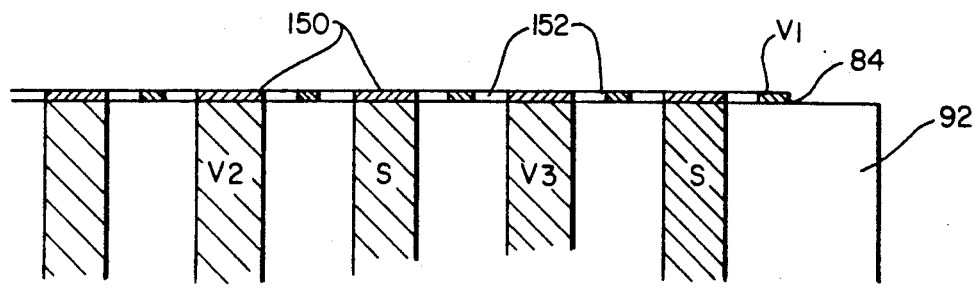
FIG. 6 is a sectional view taken along the line 6—6 in FIG. 5.

Turning now to FIGS. 5–12, steps involved in the fabrication of voltage distribution layers 58 will be described. In FIGS. 5 and 6, a lower voltage distribution layer 84 is shown. That layer is comprised of a conductive metal and enables distribution of a voltage V1. Metal layer 84 is deposited on the uppermost surface of glass-ceramic portion of interposer module 50. Signal Vias S and voltage Vias V2 and V3 (see FIG. 6) make connections with conductive islands 150 that are separated from layer 84 by etched doughnut-shaped, conductor-free areas 152. As shown in FIG. 5, voltage vias 154 (V1) make connection to the underside of conductive layer 84 and provide voltage V1 thereto.

Figure 7:
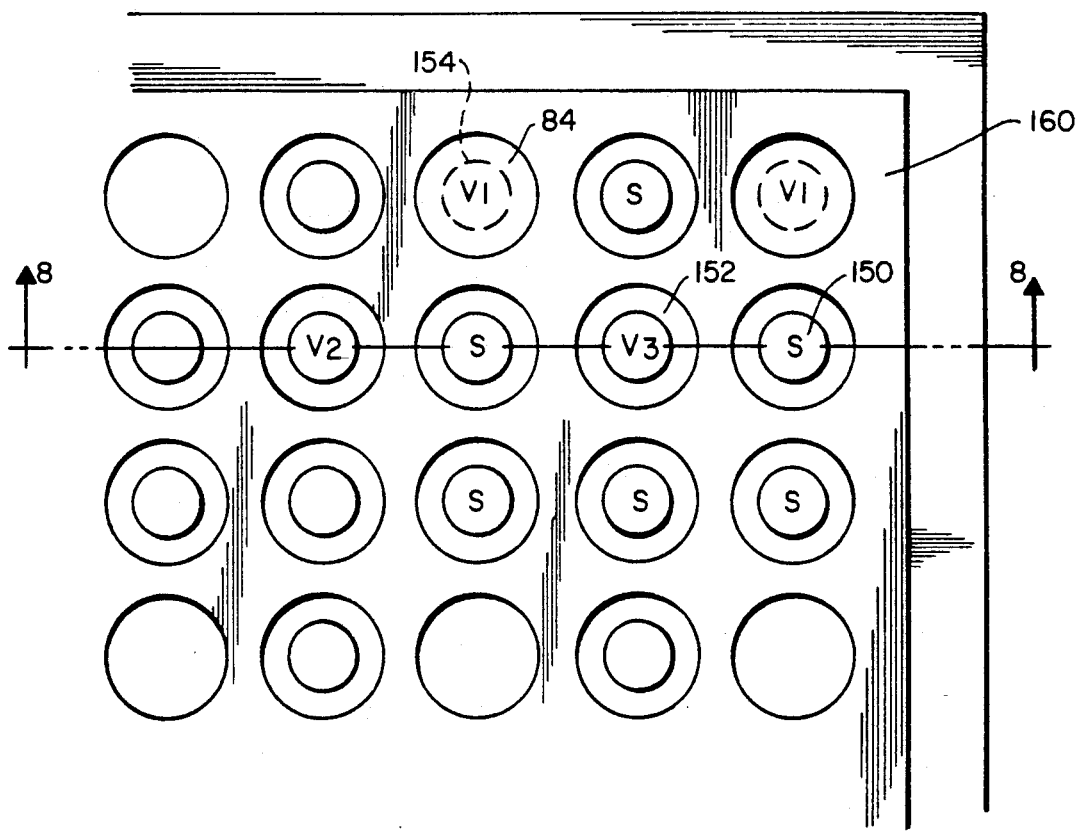
FIG. 7 is a plan view of the capacitive dielectric layer within the interposer module.
Figure 8:
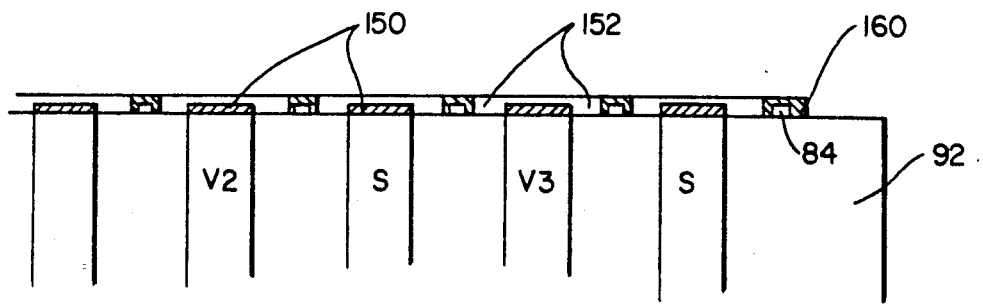
FIG. 8 is a sectional view taken along the line 8—8 in FIG. 7.

As shown in FIGS. 7 and 8, a dielectric layer is subsequently laid down over conductive layer 84, but is masked so that doughnut-shaped areas 152 remain, as well as the conductive island areas on the V2, V3 and S vias.

Figure 9:
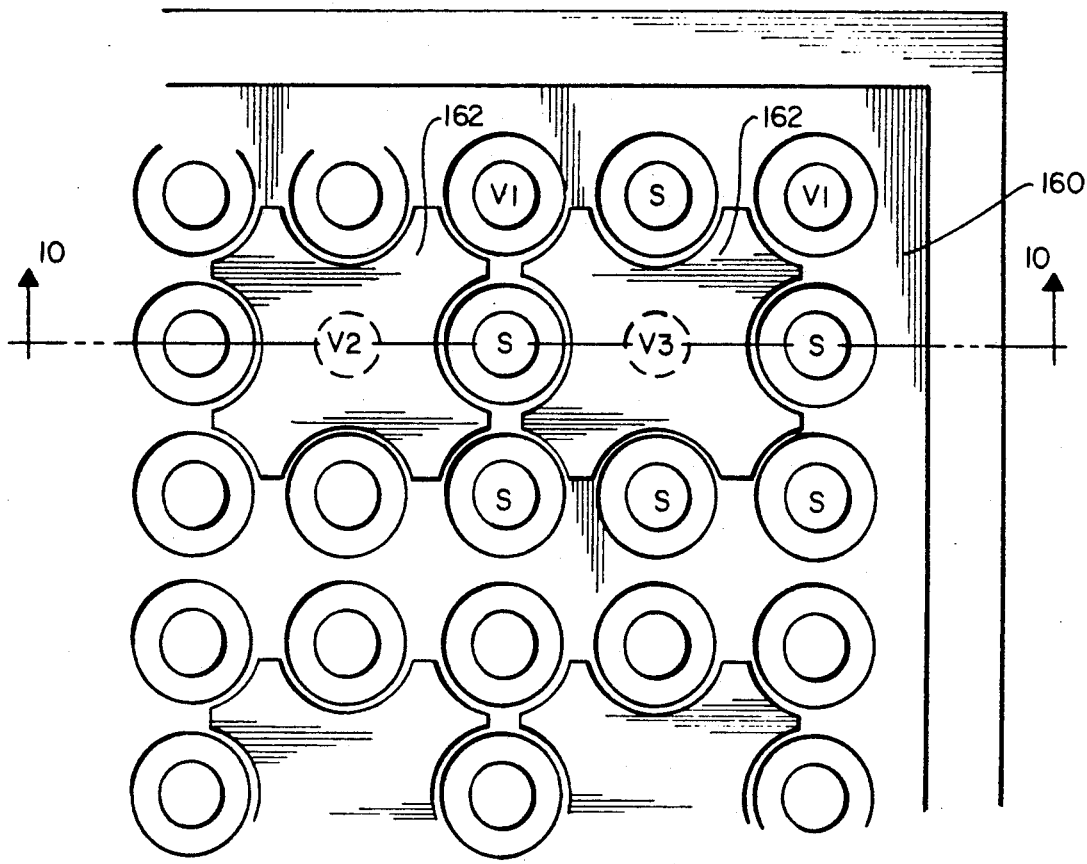
FIG. 9 is a plan view of a second capacitive metal layer within the interposer module.
Figure 10:
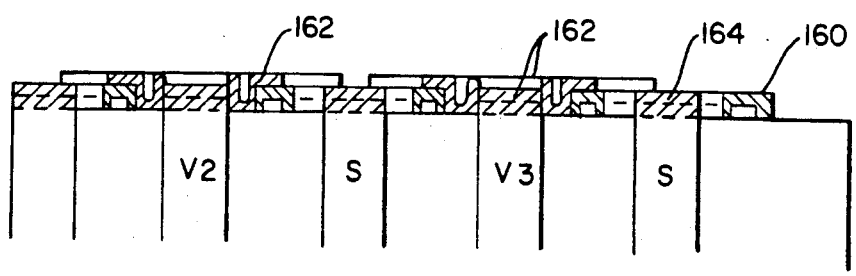
FIG. 10 is a sectional view taken along line 10—10 in FIG. 9.

Subsequently, as shown in FIGS. 9 and 10, a second metal layer 162 is laid down over insulating layer 160. In this instance, metal layer 162 is masked so that it adds to but does not short any of the signal S vias, and fills in the regions over the V2 and V3 vias with conductive islands. Thus, the portion of conductive layer 162 which covers via V2 (to the upper left of FIG. 9), provides a plate of a capacitor which has voltage V2 applied thereto. Similarly, conductive layer 162 which overlays the via having the voltage V3 also forms the plate of a capacitor however, in this instance it is powered at the V3 level. When conductive layer 162 is laid down, additional conductive layers are emplaced on the signal vias so as to grow their upper surfaces 164 to a level coincident with the upper layer of insulating layer 160.

Figure 11:
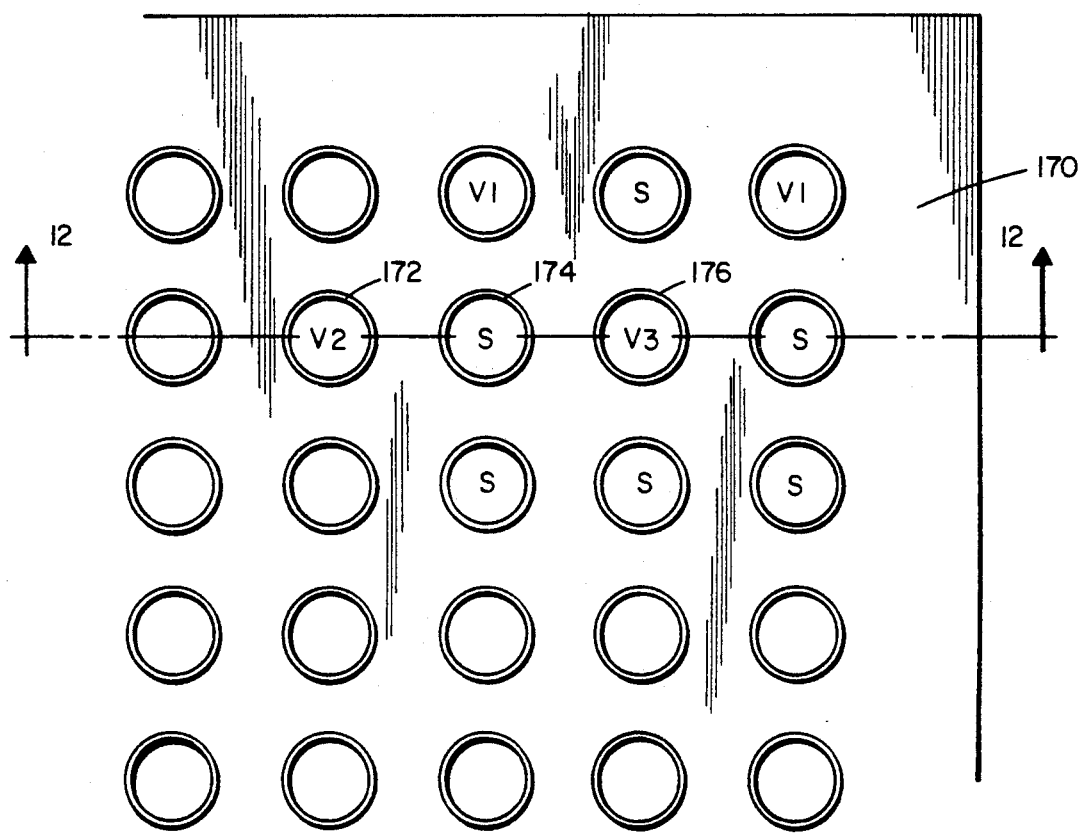
FIG. 11 is a plan view of the capacitive layer after a passivation layer and contact metalization have been placed thereover.
Figure 12:
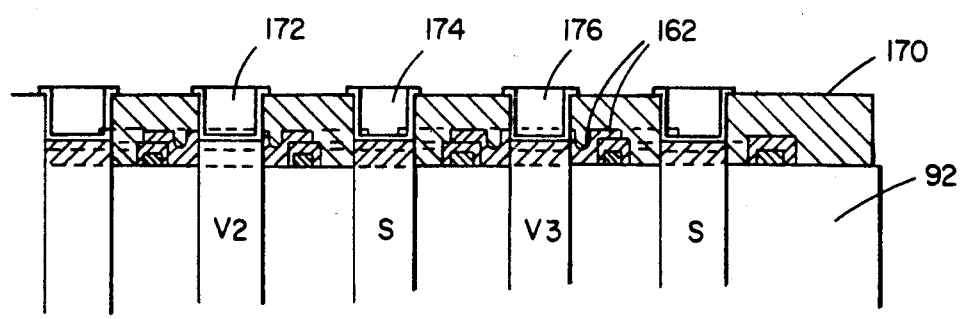
FIG. 12 is a sectional view of FIG. 11 taken along line 12—12.

Turning now to FIGS. 11 and 12, subsequent to the deposition of the second metalization layer 162, a layer of polyimide 170 is deposited over the surface of the interposer module. Polyimide layer 170 is then masked and openings are etched to expose underlying conductive surfaces as shown in FIG. 12. At that point, an additional metalization layer is laid down into the etched openings so as to create solder ball cavities 172, 174, 176 etc. Cavity 174 connects to the uppermost surface of a signal S via whereas cavities 172 and 176 contact conductive layers 162 which, in turn, are in contact with voltage vias V2 and V3. In this manner, discrete voltages are brought out to the uppermost surface of interposer module 50, while at the same time preserving the decoupling capacitance between the voltage distribution layers.

Figure 13:
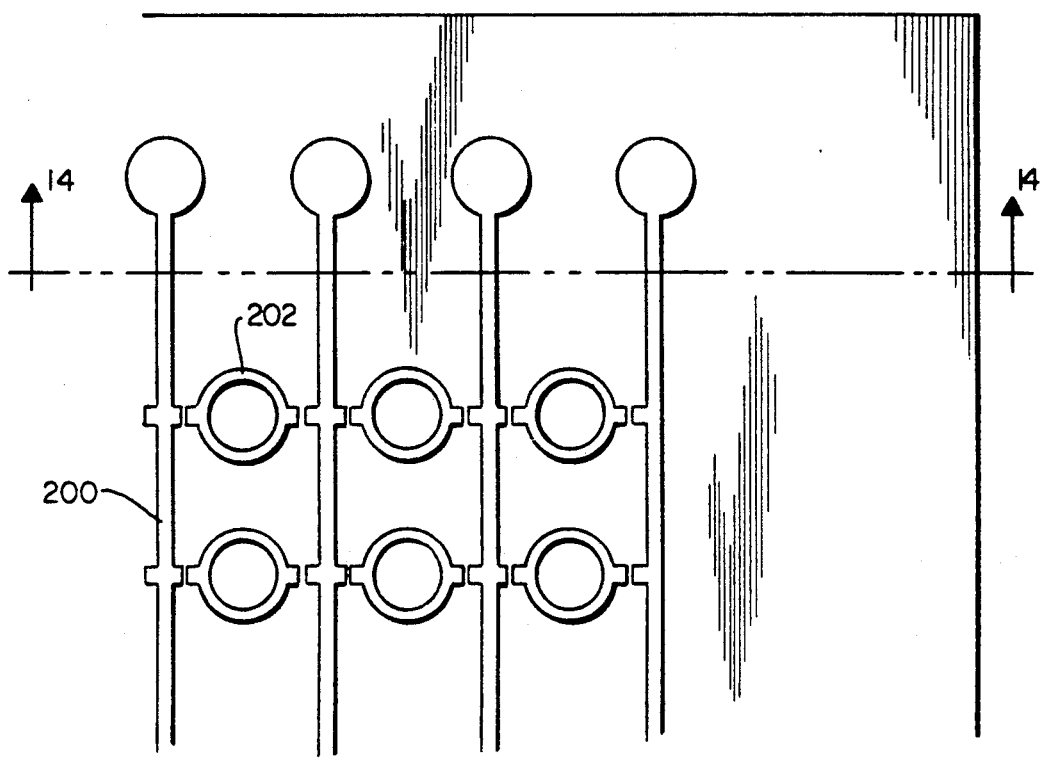
FIG. 13 is a plan view showing a decal used to fabricate engineering change Y-oriented lines.
Figure 14:
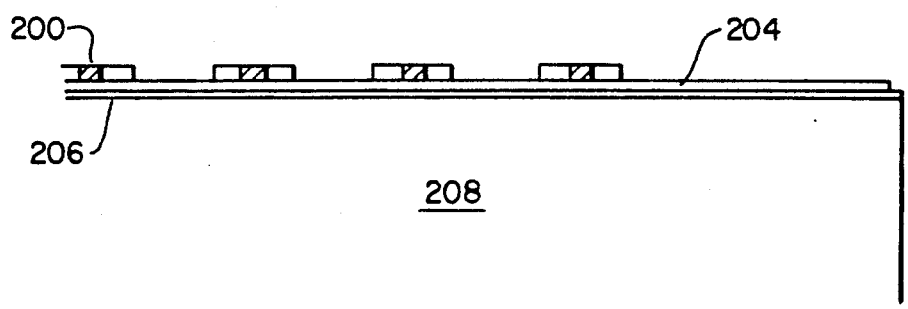
FIG. 14 is a sectional view of FIG. 13 taken along line 14—14.

Turning now to FIGS. 13 et sequence, a decal fabrication process for the engineering change lines will be described. In FIG. 13, a Y engineering change conductor decal 200 is shown. Decal 200 is comprised of an appropriate conductor material, e.g. copper, and includes a metal ring 202 at the site of each via, which ring eventually makes contact with the conductive via. As shown in FIG. 14, decal 200 is mounted on a polyimide layer 204 which is, in turn, supported by a photorelease layer 206. A quartz plate 208 serves as a temporary carrier for the aforesaid structure. As will become apparent, a laser is employed to scan through quartz plate 208 and actuate release layer 206 so that the decal layers may be adhered to glass-ceramic body of the interposer module 50.

Figure 15:
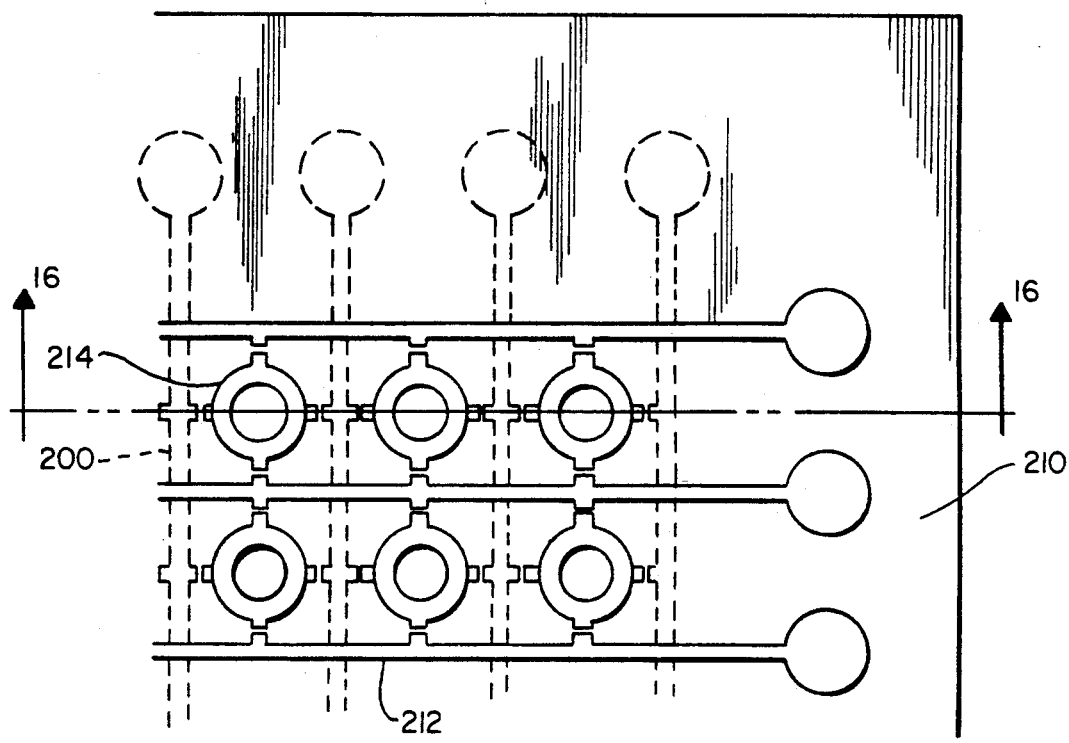
FIG. 15 is a plan view showing the placement of X engineering change decal lines over Y engineering change decal lines in the interposer module.
Figure 16:
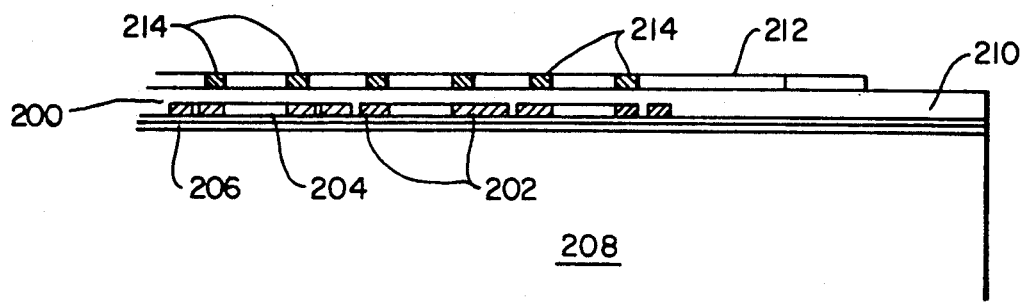
FIG. 16 is a sectional view of FIG. 15 taken along line 16—16.

Turning now to FIGS. 15 and 16, a second polyimide layer 210 is laid down over X conductor decal 200, and then a Y engineering conductor decal 212 is adhered thereto. Metal rings 214 are registered with underlying metal rings 202.

Figure 17:
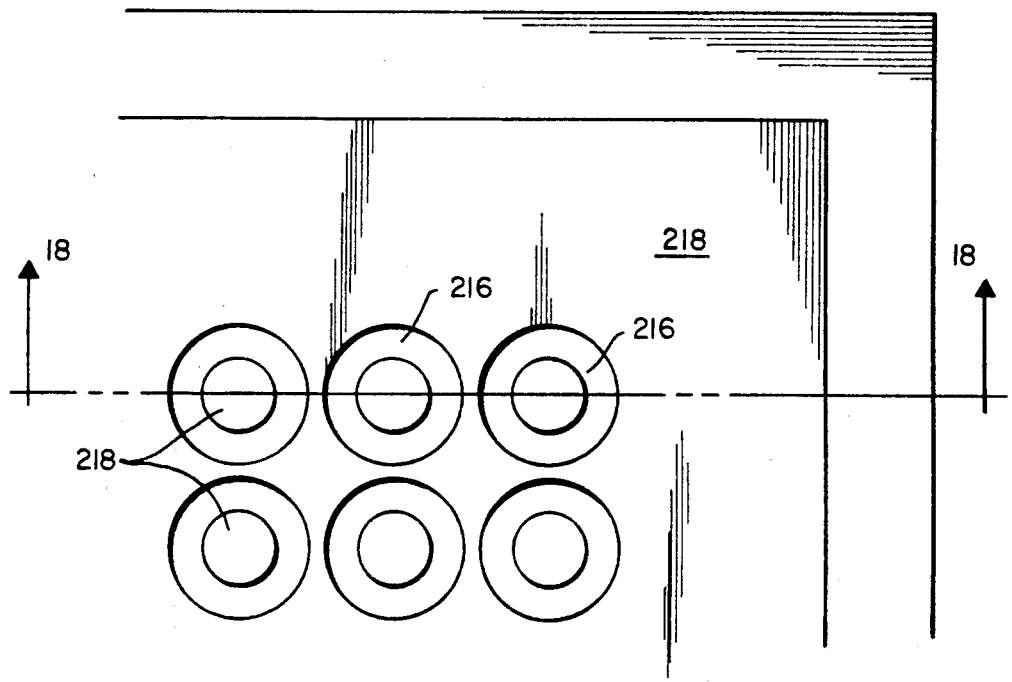
FIG. 17 is a plan view of a reference voltage plane after emplacement over the X and Y decal lines.
Figure 18:
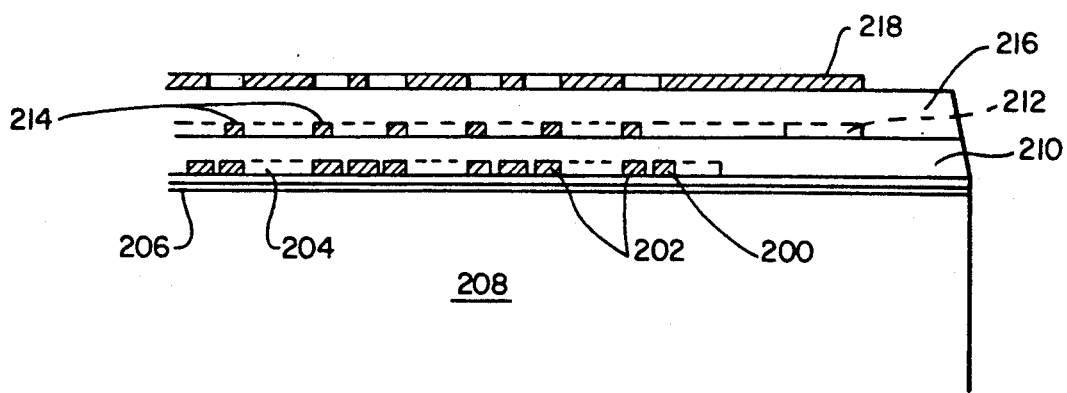
FIG. 18 is a sectional view taken along line 18—18 in FIG. 17 showing the fabricated engineering change layers before transfer.
Figure 19:
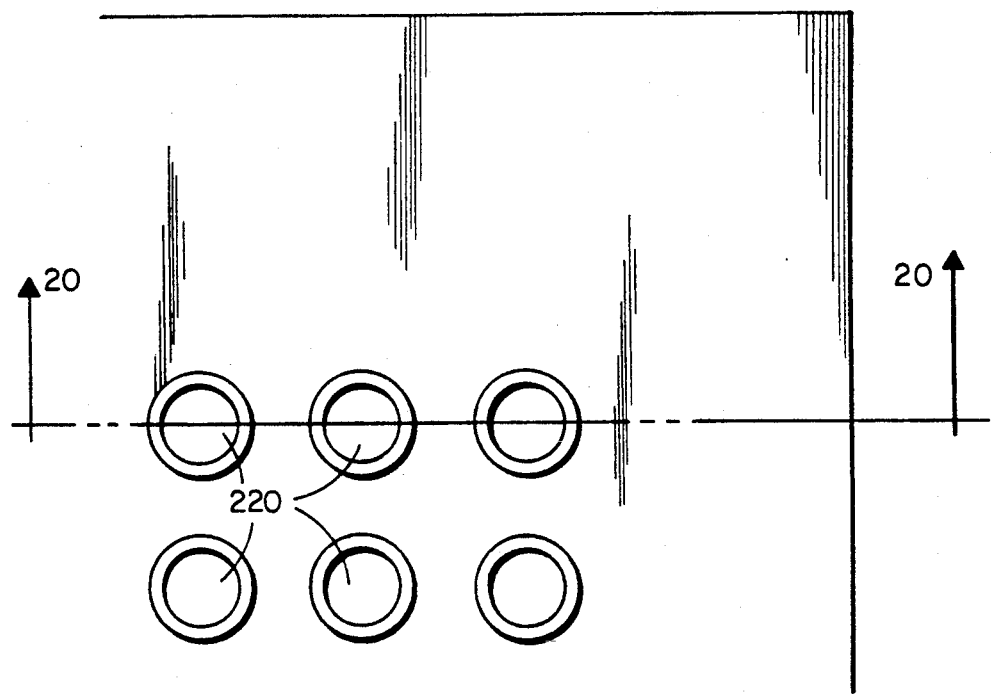
FIG. 19 is a plan view showing contact holes drilled and metalized after transfer of the decals.

As shown in FIGS. 17 and 18, an additional polyimide layer 216 is then laid down over decal X wiring 212 and a ground plane 218 is emplaced thereon. Ground plane 218 is etched so as to leave doughnut-shaped areas therein which expose underlying polyimide layer 216 (see FIG. 17). The center portions of the doughnut-shaped openings are retained and form interconnection points for vias (to be hereinafter constructed).

Figure 20:
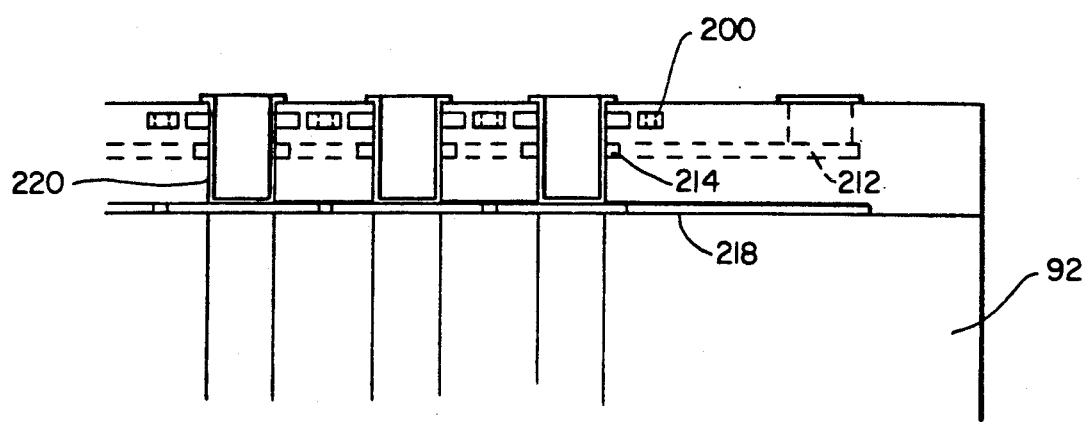
FIG. 20 is a sectional view of FIG. 19 taken along line 20—20.

Transfer of the decal structure shown in FIG. 18 is then accomplished by emplacing ground plane 218 over a matching metal plane on the surface of glass-ceramic interposer substrate 92, and releasing photorelease layer 206 by photoexposure of the film. A cross section of this structure is shown in FIG. 20. After transfer of the decal film, holes 220 are produced to expose the conductive island areas remaining in the doughnut portions of conductive layer 218. Subsequently, each of the holes is metalized to provide a solder ball cavity.

Figure 21:
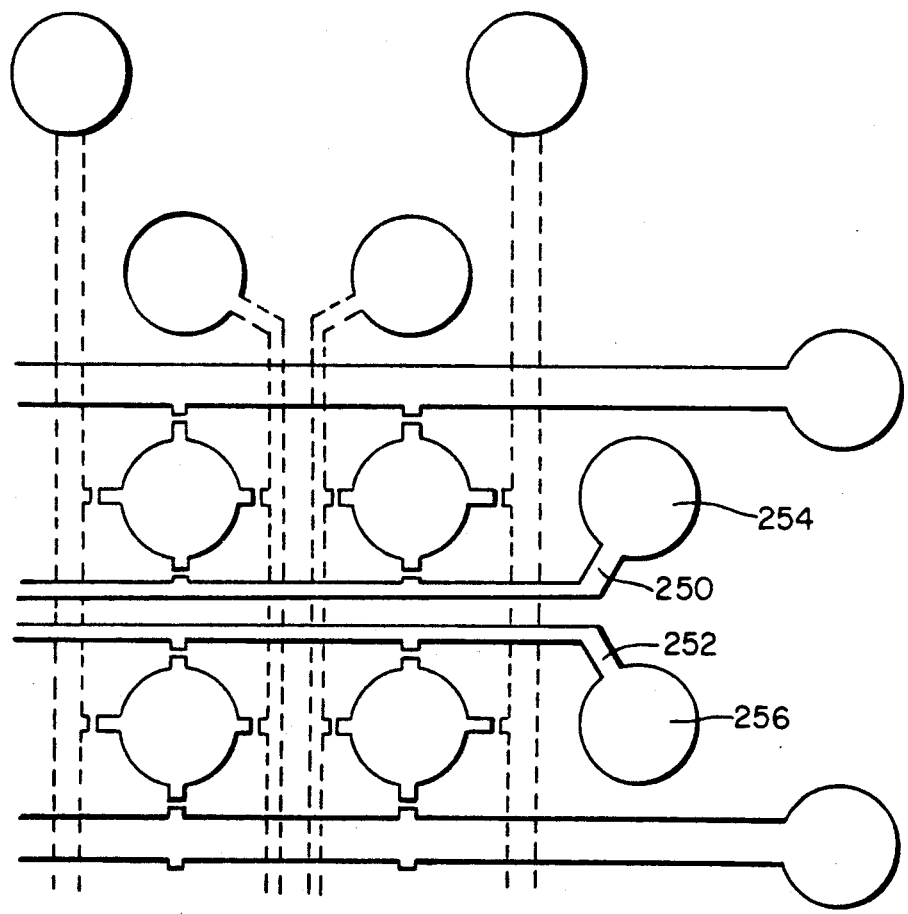
FIG. 21 is plan view of a modified wiring decal arrangement which provides added engineering change capability for the interposer module.

The engineering change capacity of the above described structure can be increased. Since the X and Y wires are also used for long lines that pass through each interposer module, the capacity to connect solder balls can be used up. This problem can be alleviated by adding additional lines to each wiring channel as shown in FIG. 21. In lieu of providing just a single X and/or Y engineering change line per channel, a pair of conductor lines pass through each channel. In addition, added peripheral solder ball cavities 254 and 256 are provided at opposing ends of conductors 250 and 252 respectively so that the engineering change capability may be essentially doubled if all channels contain a pair of conductor lines.

As can be seen from the above, the provision of an interposer module that combines the functions of distributed decoupling capacitance and significant engineering change capability enables a wall-to-wall chip arrangement of high density. The structure enables an extremely low inductance to be achieved which is suitable for the fastest bipolar circuits. The provided engineering change capability has little impact on substrate wiring capacity and avoids the need for modification to the substrate to make an engineering change.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A semiconductor package for supporting and interconnecting semiconductor chips, each of said chips having respective chip contacts on a contact surface, said package also including a substrate having substrate contacts on a contact surface and a plurality of interposer modules each of which is disposed between a chip in said package and said substrate contact surface, each of said interposer modules having respective upper and lower opposed surfaces and a planar size which allows substantial wall-to-wall placement of said semiconductor chips and interposer modules and comprising:
   a first plurality of contacts on said respective upper surface, said first plurality of contacts positioned to mate with said respective chip contacts;
   a second plurality of contacts on said respective lower surface, said second plurality of contacts positioned to mate with said substrate contacts;
   a set of conductive vias in each of said interposer modules for connecting said first plurality of contacts with a first subset of said second plurality of contacts;
   layers of engineering change wiring positioned in said plurality of interposer modules and adjacent said respective lower surfaces said engineering change wiring including at least one layer of parallel conductors connected to a second subset of said second plurality of contacts, said parallel conductors passing adjacent a plurality of conductive vias and selectively interconnectable therewith to achieve an electrical connection between a respective via and a respective one of said second plurality of contacts in said second subset; and
   distributed capacitive means positioned within each of said interposer modules adjacent said upper surface and connected to selected ones of said first plurality of contacts.

2. The semiconductor package as recited in claim 1 wherein said engineering change wiring further comprises:
   first and second layers of spaced apart, substantially parallel conductors, the conductors of said first and second layers being substantially orthogonal, said conductors connected to said second subset of said second plurality of contacts.

3. The semiconductor package as recited in claim 2, wherein each of said parallel conductor connects to a respective pair of contacts in said second subset of said second plurality of contacts and is selectively disconnectable therefrom to enable a respective via to be interconnected with only one contact of said pair of contacts.

4. The semiconductor package as recited in claim 3 wherein said distributed capacitance means comprises:
   a first conductive voltage distribution plane connected to selected ones of said conductive vias;
   a second conductive voltage distribution plane connected to said others of said conductive vias; and a dielectric layer disposed between said voltage distribution planes.

5. The semiconductor package as recited in claim 4 wherein said second voltage distribution plane is segmented, with individual segments being connected to separate conductive vias.

6. The semiconductor package as recited in claim 5 wherein said first and second voltage distribution planes are provided with apertures through which signal-carrying vias extend.

7. The semiconductor package as recited in claim 6 further comprising a plurality of solder ball-receiving cavities in said first opposed surface of each of said interposer modules, selected ones of said solder ball cavities in contact with said first voltage distribution plane, others of said cavities in contact with said second voltage 8. The semiconductor package as recited in claim 3 wherein a plurality of parallel conductive lines are positioned between rows of conductive vias, each of said plurality of conductive lines connected to a pair of said second subset lower surface contacts.

* * * * *

UNITED STATES PATENT AND TRADEMARK OFFICE
CERTIFICATE OF CORRECTION

PATENT NO. : 5,177,594

DATED : January 5, 1993

INVENTOR(S) : Chance et al.

It is certified that error appears in the above-identified patent and that said Letters Patent is hereby corrected as shown below:

In Claim 7, col. 10, line 6 after "voltage" and before the period, insert the following --distribution plane segments and still others of said cavities in contact with signal vias--.

Signed and Sealed this

Nineteenth Day of October, 1993

Attest:

BRUCE LEHMAN

Attesting Officer      Commissioner of Patents and Trademarks